(12) United States Patent
Numata

(10) Patent No.: US 7,592,646 B2
(45) Date of Patent: Sep. 22, 2009

(54) SEMICONDUCTOR DEVICE WITH A SIGE LAYER HAVING UNIAXIAL LATTICE STRAIN

(75) Inventor: Toshinori Numata, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/389,534

(22) Filed: Mar. 27, 2006

(65) Prior Publication Data

US 2006/0267046 A1    Nov. 30, 2006

(30) Foreign Application Priority Data

May 25, 2005    (JP)    ............................. 2005-152373

(51) Int. Cl.
    *H01L 29/165*    (2006.01)
(52) U.S. Cl. ................ 257/192; 257/347; 257/E29.085
(58) Field of Classification Search ................. 257/192, 257/347, E29.068, E29.084, E29.085
    See application file for complete search history.

(56) References Cited

U.S. PATENT DOCUMENTS

| 6,774,390 | B2 * | 8/2004 | Sugiyama et al. ............ 257/19 |
| 6,943,087 | B1 * | 9/2005 | Xiang et al. ................ 438/311 |
| 7,193,269 | B2 | 3/2007 | Toda et al. |
| 7,338,834 | B2 * | 3/2008 | Clifton ........................ 438/95 |
| 7,482,671 | B2 | 1/2009 | Toda et al. |
| 2002/0179946 | A1 * | 12/2002 | Hara et al. ................... 257/288 |
| 2004/0188760 | A1 * | 9/2004 | Skotnicki et al. ............ 257/347 |
| 2005/0032275 | A1 | 2/2005 | Toda et al. |
| 2005/0056892 | A1 * | 3/2005 | Seliskar ...................... 257/348 |
| 2005/0260809 | A1 * | 11/2005 | Tezuka et al. ................ 438/199 |
| 2006/0099752 | A1 * | 5/2006 | Xiang et al. ................. 438/197 |
| 2006/0163647 | A1 | 7/2006 | Toda et al. |

FOREIGN PATENT DOCUMENTS

| JP | 2002-176174 | 6/2002 |
| JP | 2003-179157 | 6/2003 |
| JP | 2004-235332 | 8/2004 |
| JP | 2005-79215 | 3/2005 |

OTHER PUBLICATIONS

M. Jurczak et al., "Silicon-on-Nothing (SON)—and Innovative Process for Advanced CMOS," Nov. 2000, IEEE Transactions on Electron Devices, vol. 47, No. 11, pp. 2179-2185.*

(Continued)

*Primary Examiner*—Minh-Loan T Tran
*Assistant Examiner*—W. Wendy Kuo
(74) *Attorney, Agent, or Firm*—Nixon & Vanderhye, PC

(57) ABSTRACT

A semiconductor device includes a MIS transistor. The device includes a buried insulating film formed in one part of a substrate, the buried insulating film being elongated in a gate-width direction and shortened in a gate-length direction of the MIS transistor. A first semiconductor layer is formed on the buried insulating film and has uniaxial lattice strain. A second semiconductor layer covers both sides of the buried insulating film and both sides of the first semiconductor layer, the sides being opposite in the gate-length direction. A gate electrode is formed on the first semiconductor layer with a gate insulating film being formed between the gate electrode and the first semiconductor layer. A source region and a drain region are formed in the second semiconductor layer.

6 Claims, 6 Drawing Sheets

OTHER PUBLICATIONS

Numata et al., "Performance Enhancement of Partially-and Fully-Depleted Strained-SOI MOSFETs and Characterization of Strained-Si Device Parameters", IEDM Tech. Dig. pp. 177-180, Dec. 2004.
U.S. Appl. No. 11/437,730, filed May 22, 2006—Irisawa et al.

Office Action in Japanese Application No. 2005-152373, dated Apr. 7, 2009 and English-language translation thereof.
Office Action in Japanese Application No. 2005-152373, dated Jan. 13, 2009 and English-language translation thereof.

* cited by examiner

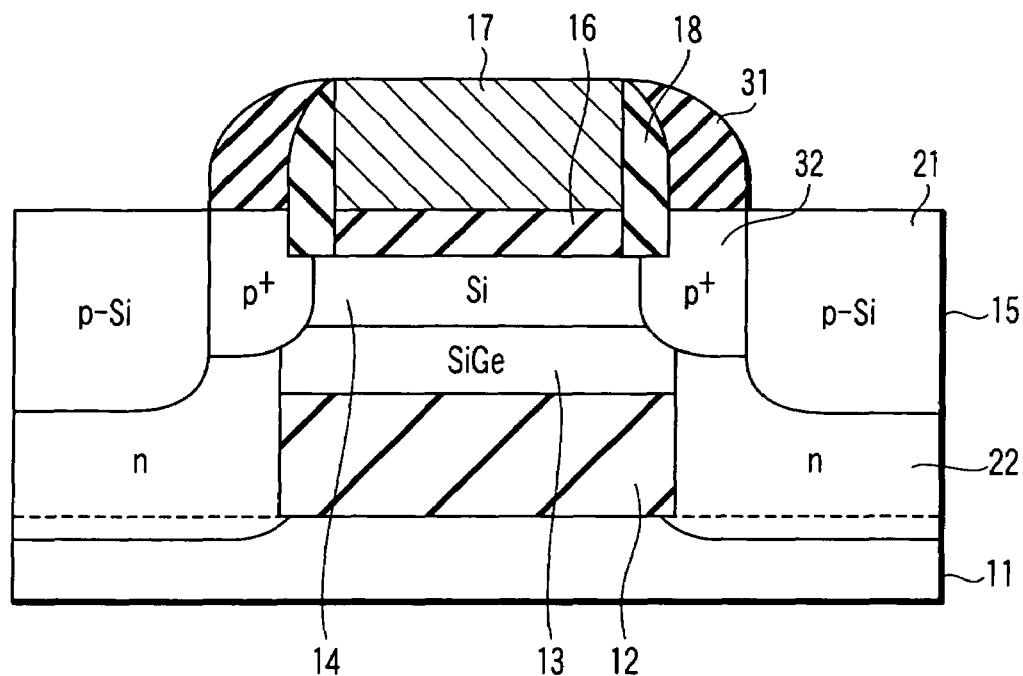
F I G. 4
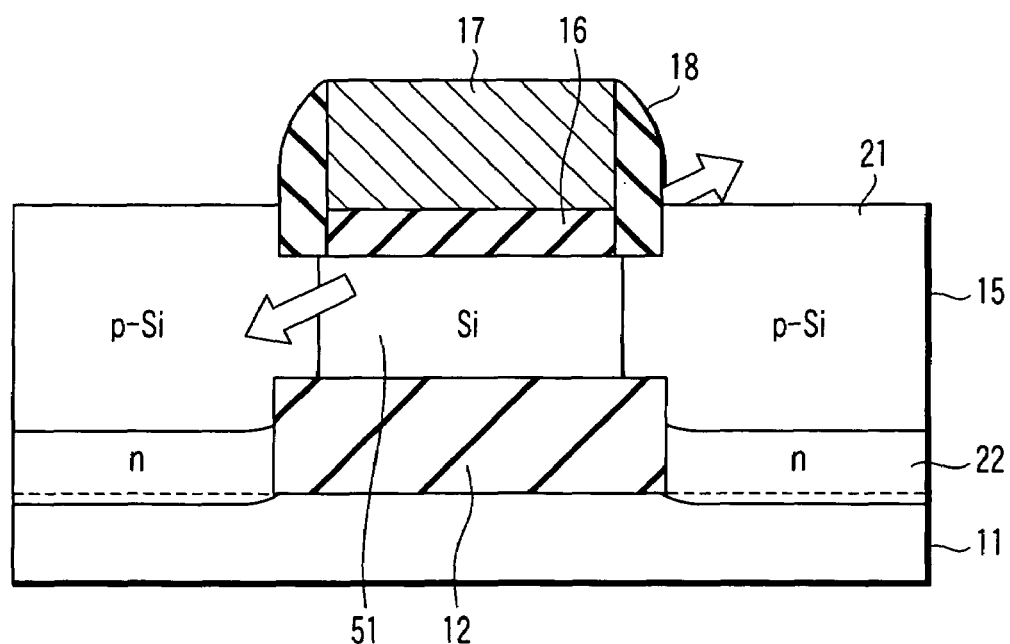
F I G. 5

SEMICONDUCTOR DEVICE WITH A SIGE LAYER HAVING UNIAXIAL LATTICE STRAIN

CROSS-REFERENCE TO RELATED APPLICATIONS

This application is based upon and claims the benefit of priority from prior Japanese Patent Application No. 2005-152373, filed May 25, 2005, the entire contents of which are incorporated herein by reference.

BACKGROUND OF THE INVENTION

1. Field of the Invention

This present invention relates to a semiconductor device in which metal-insulator semiconductor (MIS) transistors are formed in a semiconductor layer provided on an insulating film. More particularly the invention relates to a semiconductor device that has a strained semiconductor layer and to a method of manufacturing this semiconductor device.

2. Description of the Related Art

Metal-oxide semiconductor (MOS) field-effect transistors (hereinafter referred to as MOSFETs) fabricated on a silicon-on-insulator (SOI) substrate have a low junction capacitance. Therefore, they are fit for use in high-speed LSIs and low-power-consumption LSIs. Any Si layer epitaxially grown on an SiGe layer has a crystal structure that is strained because of the difference between its lattice constant and that of the SiGe layer. MOSFETs fabricated on such a strained Si layer are suitable for use in high-speed LSIs since the mobility increases as the band structure modulates.

SOI-MOSFETs, each comprising such a SOI substrate and such a strained layer as described above, are elements more suitable for use in high-speed, low-power-consumption LSIs. (See Toshinori Numata, Toshifumi Irisawa, Tsutomu Tezuka, Junji Koga, Norio Hirashita, Koji Usuda, Eiji Toyoda, Yosiji Miaymura, Akihiko Tanabe, Naoharu Sugiyama, and Shinichi Takagi, "Performance enhancement of partially and fully-depleted strained-SOI MOSFETs and characterization of stained-Si device parameters" IEDM Tech. Dig., pp. 177-180, December 2004.)

The SOI-MOSFET is manufactured as follows. First, a lattice-relaxed SiGe layer is formed on a buried insulating film provided on an Si substrate. Then, a strained Si layer is formed on the SiGe layer. Subsequently, a gate electrode is formed on the strained Si layer, and a source and a drain are formed in the strained Si layer. Since the strained Si layer has been epitaxially grown on the SiGe layer, it has tensile stress acting along two axes that are parallel to the upper surface of the substrate.

Strained SOI-MOSFETs of this type are disadvantageous in the following respects. Unless the SiGe layer has high Ge composition, the strained Si layer cannot acquire sufficiently high hole mobility. If the Ge composition of the SiGe layer is too high, the SiGe layer and the strained Si layer can hardly maintain good crystallinity. The thinner the SOI film, the more prominently the short-channel effect can be controlled. If the SOI film is made thin, however, its parasitic resistance will increase. Moreover, since the SOI structure has a prominent self-heating effect, the thermal hysteresis of the LSI brings forth a great performance variation between the strained SOI-MOSFETs.

The SOI structure undergoes a specific phenomenon that some layers float from the substrate. Particularly, a phenomenon, such as kink phenomenon, hysteresis effect or pass-gate effect, makes it necessary to change the circuit design. In view of this, the conventional bulk-Si circuit should be changed in terms of design. Further, the SOI structure is disadvantageous in that the drain has but a low voltage endurance.

Thus, the conventional SOI-MOSFET is disadvantageous in some respects. First, the SiGe layer and the Si layer will be degraded in crystallinity if the SiGe layer has a high Ge composition to enhance the hole mobility in the strained Si layer. Second, if the SOI film is thin enough to control the short-channel effect, its parasitic resistance will increase. Third, its performance greatly varies because the SOI structure has a prominent self-heating effect.

BRIEF SUMMARY OF THE INVENTION

According to an aspect of the present invention, there is provided a semiconductor device, comprising:

a gate for a Metal-Insulator Semiconductor (MIS) transistor on a support substrate;

a buried insulating film formed in one part of the substrate, the buried insulating film being elongated in a gate-width direction and shortened in a gate-length direction of the gate for the MIS transistor;

a first semiconductor layer formed on the buried insulating film and having uniaxial lattice strain;

a second semiconductor layer covering both sides of the buried insulating film and both sides of the first semiconductor layer, the sides being opposite in the gate-length direction;

a gate electrode for the MIS transistor formed on the first semiconductor layer with a gate insulating film being formed between the gate electrode and the first semiconductor; and a source region and a drain region for the MIS transistor which are formed in the second semiconductor layer.

According to another aspect of the invention, there is provided a semiconductor device, comprising:

a gate for a Metal-Insulator Semiconductor (MIS) transistor on a support substrate;

a buried insulating film formed in one part of the substrate, the buried insulating film being elongated in a gate-width direction and shortened in a gate-length direction of the gate for the MIS transistor;

a first semiconductor layer formed on the buried insulating film and including a SiGe layer relaxed in terms of lattice strain and a strained Si layer formed on the SiGe layer, having a tensile strain in the gate-width direction and lattice strain relaxed in the gate-length direction;

a second semiconductor layer covering both sides of the buried insulating film and both sides of the first semiconductor layer, the sides being opposite in the gate-length direction;

a gate electrode for the MIS transistor formed on the first semiconductor layer with a gate insulating film formed between the gate electrode and the first semiconductor layer; and a source region and a drain region for the MIS transistor which are formed in the second semiconductor layer.

According to still another aspect of this invention, there is provided a method of forming a semiconductor device with a Metal-Insulator Semiconductor (MIS) transistor, the method comprising:

forming a buried insulating film on a support substrate and forming a first semiconductor layer on the insulating film;

forming a gate insulating film on one part of the first semiconductor layer;

forming a gate electrode on the gate insulating film, the gate electrode being elongated in a gate-width direction and shortened in a gate-length direction of the MIS transistor;

performing selective etching on the first semiconductor layer and the buried insulating film by using the gate; and forming a second semiconductor layer on that part of the first semiconductor layer from which the first semiconductor layer and the buried insulating film have been removed, to form a source region and a drain region.

BRIEF DESCRIPTION OF THE SEVERAL VIEWS OF THE DRAWING

FIG. 4 is a sectional view schematically depicting the structure of a strained SOI-MOSFET according to a second embodiment of this invention;

FIG. 5 is a sectional view schematically depicting the structure of a modified SOI-MOSFET according to the present invention;

DETAILED DESCRIPTION OF THE INVENTION

The basic structure of a SOI-MOSFET will be described before embodiments of this invention are explained.

Figure 6:
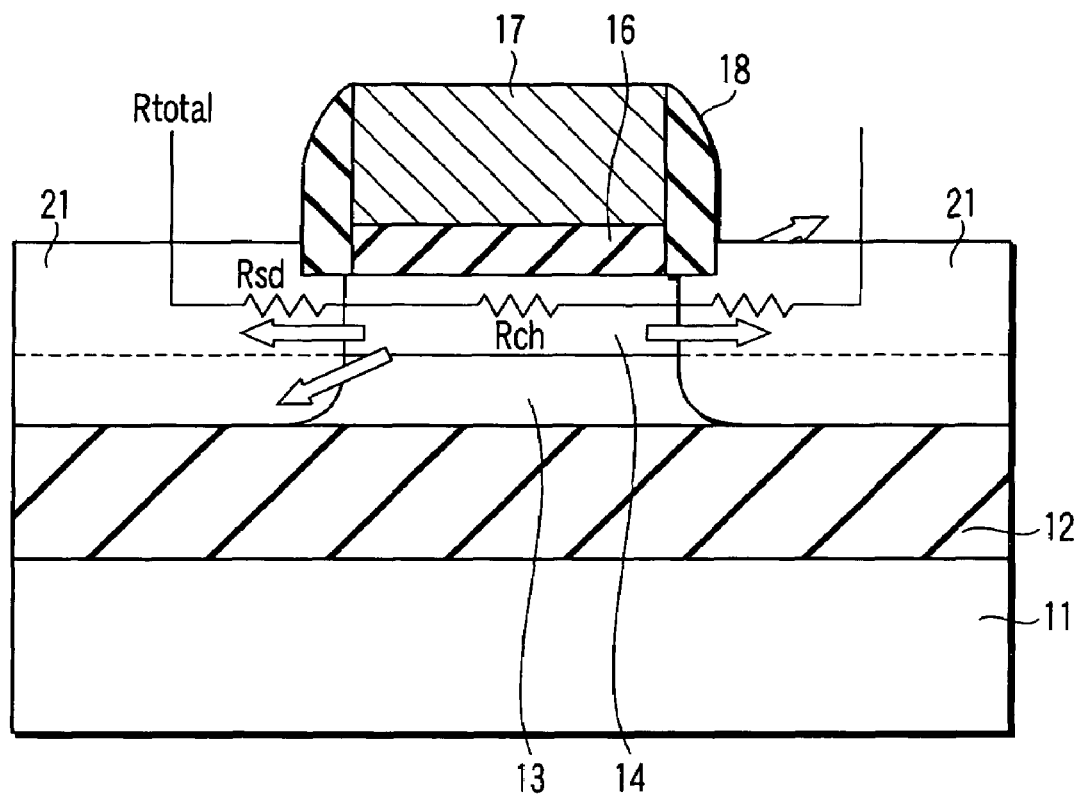
FIG. 6 is a sectional view illustrating a typical SOI-MOSFET.

As FIG. 6 shows, a lattice-relaxed SiGe layer 13 is formed on a buried insulating film 12 is formed on an Si substrate as a support substrate, and a SiGe layer 13 and a strained Si layer 14 are formed on the insulating film 12. A gate oxide film 16 is formed on the strained Si layer 14, and a gate electrode 17 is formed on the gate oxide film 16. In the strained Si layer 14 and SiGe layer 13, source and drain regions 21 are formed. A MOSFET is thus fabricated.

The strained Si layer 14 has been formed on the SiGe layer 13 by means of epitaxial growth. The Si layer 14 has tensile stress acting along two axes that are parallel to the upper surface of the substrate 11. The strained Si layer 14 has high electron mobility. The inventors hereof have examined SOI-MOSFETs of this type, finding out that they have the following disadvantages.

Figure 7:
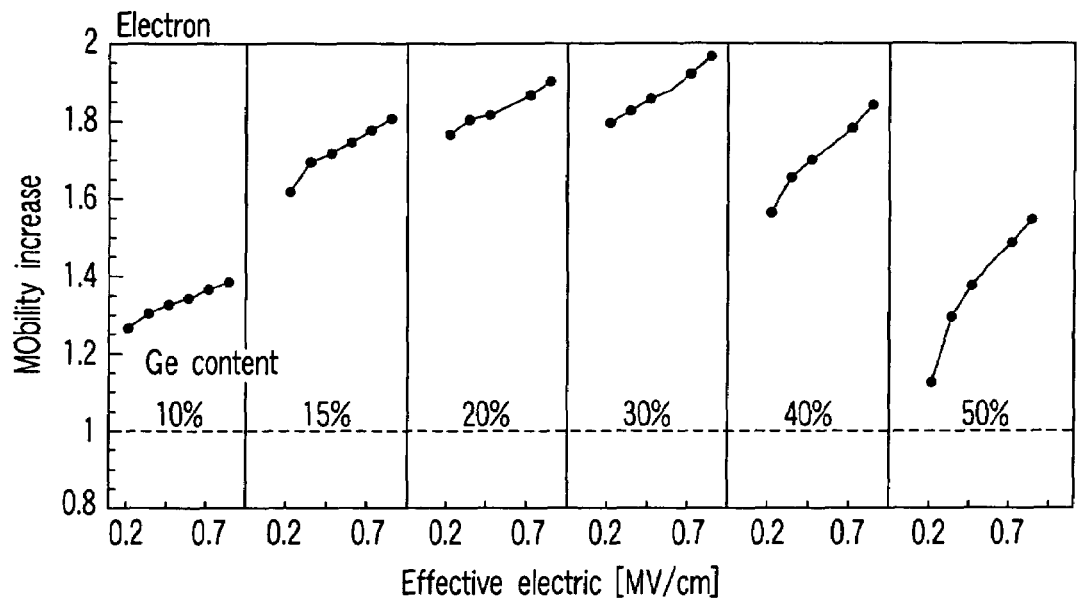
FIG. 7 is a diagram showing how the electron mobility in each of strained Si layers provided on SiGe layers of different Ge compositions, respectively, depends on the effective electric field, in comparison with the electron mobility in unstrained Si layers.
Figure 8:
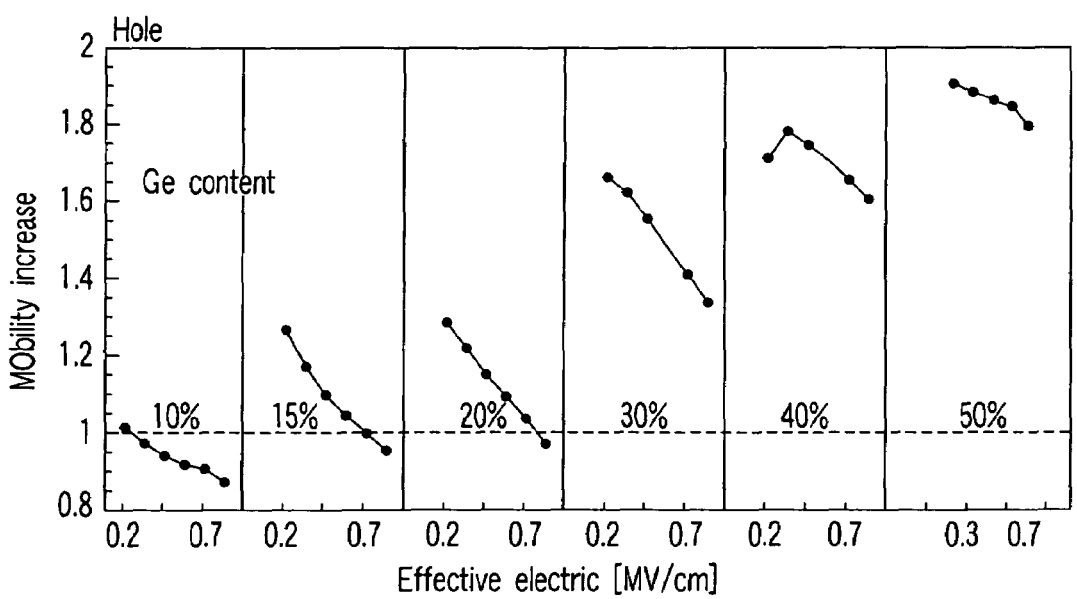
FIG. 8 is a diagram representing how the hole mobility in each of strained Si layers provided on SiGe layers of different Ge compositions, respectively, depends on the effective electric field, in comparison with the hole mobility in unstrained Si layers.

FIG. 7 explains that electron mobility is higher in a strained Si layer provided on an SiGe layer than in an unstrained Si layer. More specifically, it illustrates how the electron mobility in each of strained Si layers provided on SiGe layers of different Ge compositions, respectively, depends on the effective electric field, in comparison with the electron mobility in unstrained Si layers. FIG. 8 explains that hole mobility is higher in a strained Si layer provided on an SiGe layer than in an unstrained Si layer. More precisely, it shows how the hole mobility in each of strained Si layers provided on SiGe layers of different Ge compositions, respectively, depends on the effective electric field, in comparison with the hole mobility in unstrained Si layers.

As seen from FIG. 7, any strained Si layer has high electron mobility, regardless of the Ge composition of the SiGe layer. The electron mobility is particularly high if the Ge composition ranges from 15 to 40%. As evident from FIG. 8, any strained Si layer cannot acquire sufficiently high hole mobility unless the Ge composition of the SiGe layer is relatively high. If the SiGe layer has high Ge composition, however, the SiGe layer and the strained Si layer can hardly maintain good crystallinity and the electron mobility in the strained Si layer will decrease if the SiGe layer has high Ge composition.

To impart a gate length of 100 nm or less to the SOI element and to control the short-channel effect, it is useful to make the SOI element thinner. If the SOI element is made thinner, however, its parasitic resistance will inevitably increase.

The major resistance component of a strained SOI element is shown in FIG. 6. The smaller the element, the lower the channel resistance Rch included in the device resistance Rtotal. The lower the channel resistance Rch, the greater the influence of the parasitic resistance Rsd of the SOI element is. Hence, any thin SOI element cannot operate to its full performance. Its elevated source and drain cannot acquire sufficient thickness. An Ni germanium-silicide film formed on an SiGe layer has higher resistance than an Ni silicide film formed on an Si layer and therefore inhibits the element performance from being enhanced.

Since the strained SOI element exhibits a prominent self-heating effect, its performance greatly varies because of the thermal hysteresis of the LSI incorporating the strained SOI element. The self-heating effect of a SOI element is insufficient radiation of the Joule heat generated from the current that flows in the element inevitably because the buried oxide film has thermal resistance about 100 times the thermal resistance of a silicon film.

Figure 9:
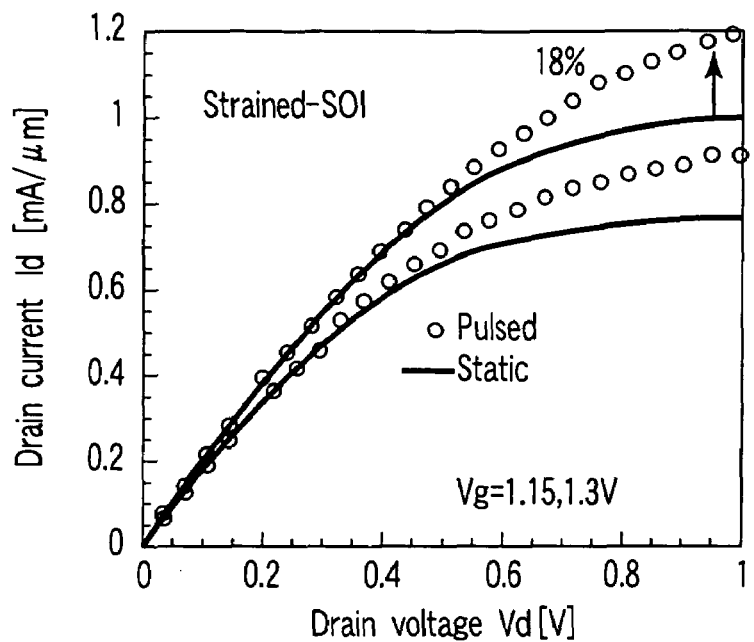
FIG. 9 is a diagram illustrating the Id-Vd characteristic of a strained SOI-MOSFET, measured by DC-detection, and the Id-Vd characteristic that the strained SOI-MOSFET will exhibit if the self-heading effect is not taken into account.
Figure 10:
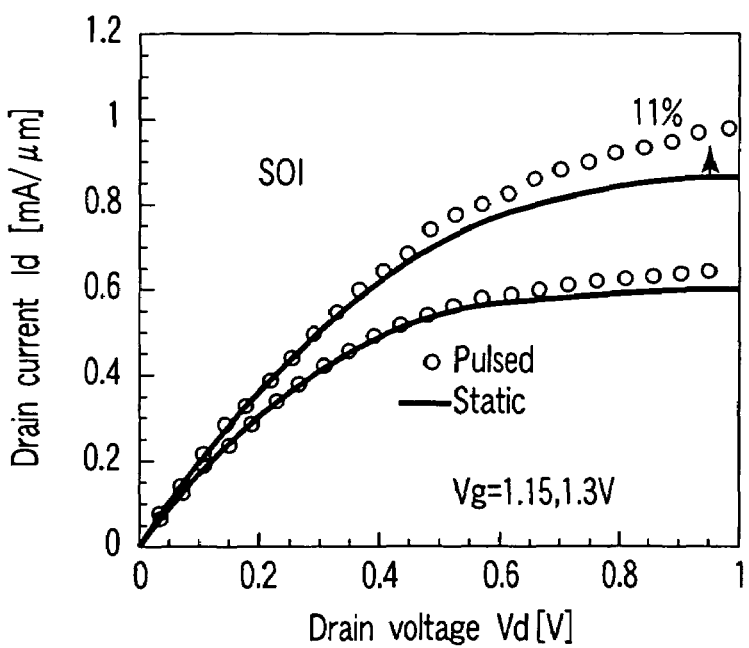
FIG. 10 is a diagram showing the Id-Vd characteristic of an unstrained SOI-MOSFET, measured by DC-detection, and the Id-Vd characteristic that the unstrained SOI-MOSFET will exhibit if the self-heading effect is not taken into account.

FIG. 9 illustrates the Id-Vd characteristic of a strained SOI-MOSFET, measured by DC-detection, and the Id-Vd characteristic that the strained SOI-MOSFET will exhibit if the self-heading effect is not taken into account. FIG. 10 shows the Id-Vd characteristic of an unstrained SOI-MOSFET, measured by DC-detection, and the Id-Vd characteristic that the unstrained SOI-MOSFET will exhibit if the self-heading effect is not taken into account.

As shown in FIG. 10, the unstrained SOI element has its performance increased by about 11% if its self-heating effect is eliminated. By contrast, the strained SOI element has its performance increased every more, by 18%, as is illustrated in FIG. 9. This is because its self-heating effect is more prominent than that of the unstrained SOI element since SiGe has a higher thermal resistance than Si. Thus, the strained SOI element is disadvantageous in that its performance greatly changes due to thermal hysteresis.

Embodiments of this invention solve these problems by leaving a selected part of the buried insulating film and by using a strained semiconductor layer that has lattice strain acting along one axis. The embodiments will be described below, with reference to the accompanying drawings.

First Embodiment

Figure 1:
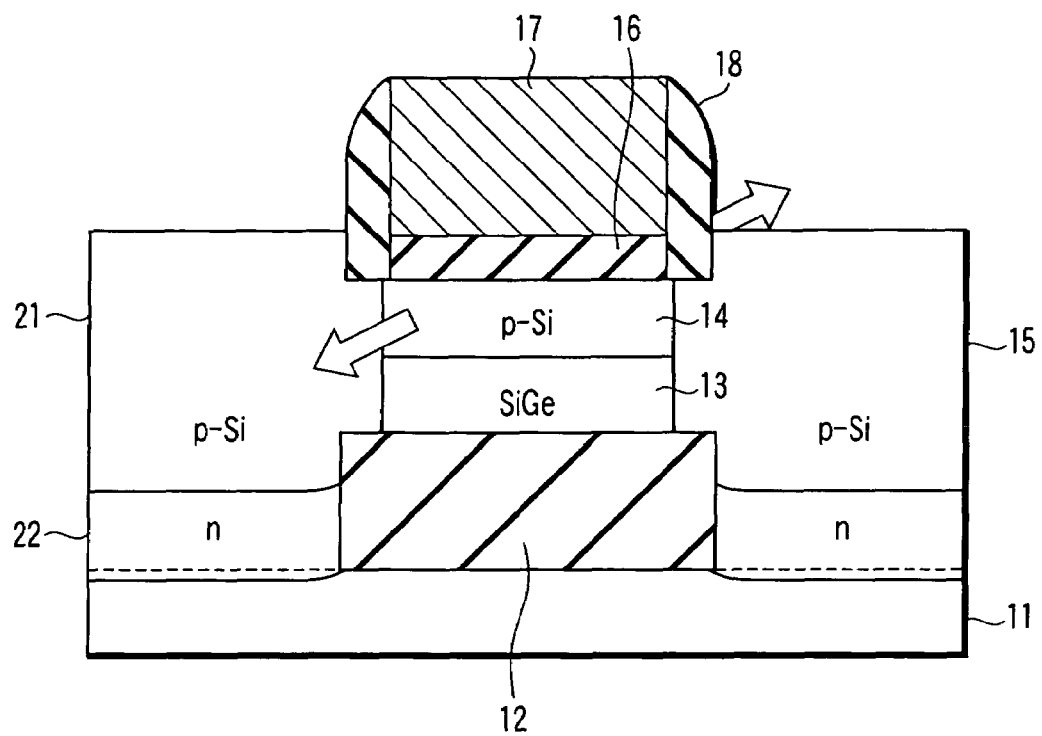
FIG. 1 is a sectional view schematically illustrating the structure of a strained SOI-MOSFET according to a first embodiment of this invention.

FIG. 1 is a sectional view schematically illustrating the structure of a strained SOI-MOSFET according to the first embodiment of the present invention.

A buried insulating film 12 made of silicon oxide is formed on a part of substrate 11 and extends longer in a first direction (i.e., gate- widthwise direction of the gate) than in a second direction (i.e., gate-length direction) that is at right angles to the first direction. An SiGe layer 13 having Ge composition of 5 to 100% is laid on the buried insulating film 12. An Si layer 14 (i.e., first semiconductor layer) is laid on the SiGe layer 13. The SiGe layer 13 has a relaxed lattice strain. The Si layer 14 has tensile strain acting in only one direction, in the gate-width direction. An Si layer 15 (i.e., second semiconductor layer) is formed on both sides of the buried Si layer 12, SiGe layer 13 and strained Si layer 14, with respect to the gate-length direction.

The strained Si layer 14 is an n-type layer. A gate insulating oxide film 16 (gate insulating film) is formed on the strained Si layer 14. A gate electrode 17 made of polysilicon is formed on the gate insulating oxide film 16. An insulating sidewall 18 is formed on the sides of the gate electrode 17. In the Si layer 15, p-type source and drain regions 21 are formed. A depletion-inhibiting layer 22 is formed in the bottom region of the source and drain regions 21. Note that the layer 22 is of n-type, i.e., the conductivity type opposite to that of the source and drain regions 21.

FIGS. 3A to 3D are sectional views explaining the steps of manufacturing the SOI-MOSFET shown in FIG. 1.

Figure 3A:
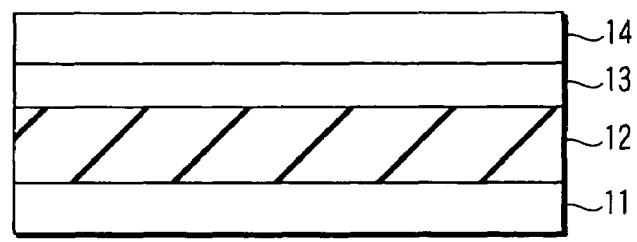
FIGS. 3A to 3D are sectional views explaining the steps of manufacturing the SOI-MOSFET shown in FIG. 1.

First, a buried insulating film 12 is formed on the substrate 11 made of Si as is illustrated in FIG. 3A SiGe layer 13 having Ge composition of 5 to 100% and a Si layer 14 (first semiconductor layer) are formed on the buried insulating film 12. A SOI substrate is thereby provided. The SOI substrate comprises the lattice-relaxed SiGe layer 13 and the Si layer 14 provided on the SiGe layer 13 and a compression stain acting along two axes.

Figure 2:
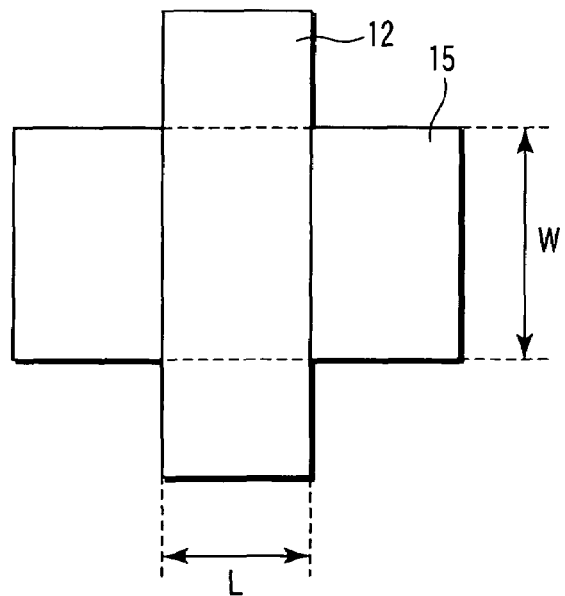
FIG. 2 is a plan view showing a pattern of the buried insulating film and semiconductor substrate of the strained SOI-MOSFET shown in FIG. 1.
Figure 3B:
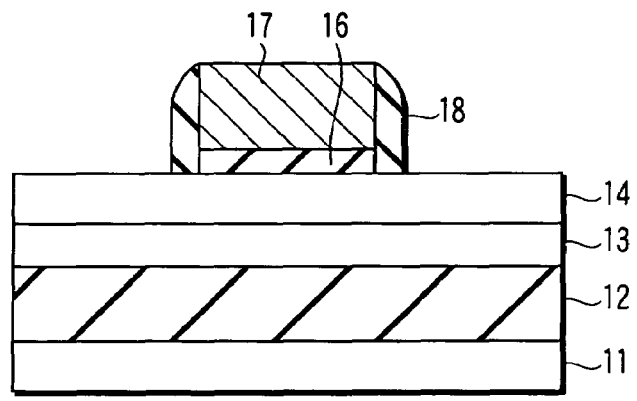

As shown in FIG. 3B, a gate oxide film 16 (gate insulating film) is formed on the strained Si layer 14, and a gate electrode 17 is formed on the gate oxide film 16. More specifically, an oxide film and a polysilicon film are formed on the strained Si layer 14 and patterned by means of lithography and RIE, both well known in the art. A gate electrode of the pattern shown in FIG. 2 is thereby formed. An insulating sidewall 18 is then formed on the sides of the gate electrode 17. More precisely, an insulating film, such as an oxide film or a silicide film, is deposited on the entire surface of the resulting structure and is subjected to etching achieved by RIE. Only a part of the insulating film is left not etched, on the sides of the gate electrode 17.

It is desired that the gate electrode 17 and the insulating sidewall 18 be covered with material such as silicon nitride, which is less etched than Si, SiGe and Si oxide. This is because, if covered with such material, the electrode 17 and sidewall 18 will not be etched when Si, SiGe and Si oxide layers are subjected to etching.

Figure 3C:
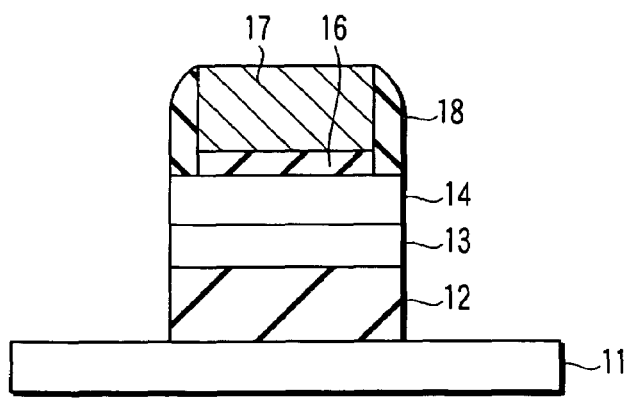

As FIG. 3C shows, the Si layer 14, SiGe layer 13 and buried insulating film 12 are etched by means of RIE using the gate electrode 17 and insulating sidewall 18 as mask. The upper surface of the substrate 11 is thereby exposed in part. At this time, the Si layer 14 is relaxed, starting at the processed edges. As a result, the Si layer 14 remains strained along one axis only. That is, as the strained Si layer 14 is processed as shown in FIG. 2, the lattice strain is moderated, because the strained Si layer 14 is short in the gate-length direction and long in the gate-width direction. By way of example and without limitation, $W \geqq 2L$, where W is a distance that the first semiconductor layer and buried insulating film extend in the gate-width direction and L is a distance that the first semiconductor layer and buried insulating film extend in the gate-length direction.

Figure 3D:
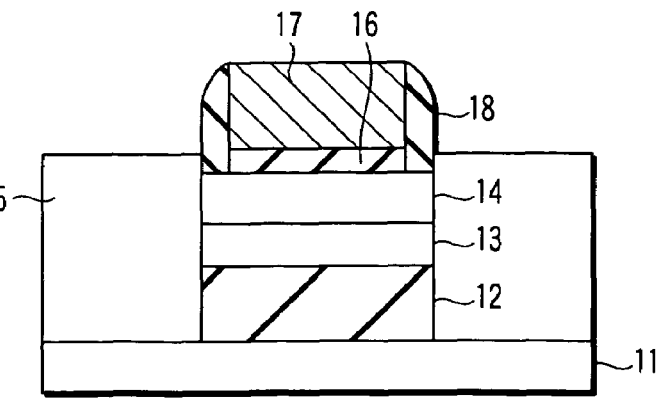

As FIG. 3D shows, silicon is epitaxially grown on the Si substrate 11. An Si layer 15, or the second semiconductor layer, is thereby formed on the sides of the buried insulating film 12, SiGe layer 13 and strained Si layer 14.

Using the gate electrode 17 and insulating sidewall 18 as mask, the Si layer 15 is doped by means of ion implantation or the like, forming p-type source and drain regions 21. A p channel MOSFET having the structure of FIG. 1 is thereby provided. In the bottom region of the source and drain regions 21, a depletion-inhibiting layer 22 may be formed to prevent the depletion layer contacting the regions 21 from expanding. The layer 22 should contain n-type impurities in high concentration, whose conductivity type is opposite to that (n-type) of the source and drain regions 21.

In the strained SOI-MOFET thus fabricated, the strained Si layer 14 maintains the strain acting in the gate-width direction, whereas the strain acting in the gate-length direction is relaxed. As a result, the strained Si layer 14 has only a tensile strain that acts in the gate-width direction. Hence, even a p-channel MOSFET according to the first embodiment can be enhanced in terms of performance, unlike a conventional p-channel MOSFET that has tensile strain acting along two axes and therefore has insufficient mobility.

Since the channel region has a SOI structure, the short-channel effect can be controlled well. Further, the source and drain regions 21 can be thick enough, because two parts of the insulating film 12 have been removed from the source and drain regions 21, respectively. This reduces the parasitic resistance and, ultimately, enhances the performance of the element to a maximum. Moreover, Si connects the channel region to the Si substrate 11, which brings forth no self-heating effect. Having no self-heating effect, the SOI element can stably work, regardless of the thermal condition in which the LSI incorporating it is operating.

The Si layer 15, or the second semiconductor layer, may be formed by carrying out epitaxial growth of silicon that contains impurities in high concentration. In this case, the impurities can be added in high concentration by ion implantation from the source and drain regions 21. Further, in this case, the source and drain regions 32 can be formed to acquire low resistance. The parasitic resistance of the SOI element can therefore be reduced still more.

In the first embodiment, the first semiconductor layer 14 that constitutes the channel of the MOSFET has lattice strain that acts along one axis only. Therefore, the mobility can be enhanced even if the SiGe layer has lower Ge composition. Since two parts of the insulating film 12 have been removed from the source and drain regions 21, respectively, these regions 21 can be thicker than otherwise. The parasitic resistance of the MOSFET can therefore be reduced. In addition, the removal of said parts of the insulating film 12 enables the second semiconductor layer 15 to connect the first semiconductor layer 14 forming the channel to the Si substrate 11. This controls the self-heating effect.

Second Embodiment

FIG. 4 is a sectional view schematically depicting the structure of a strained SOI-MOSFET according to the second embodiment of this invention. The components that are identical to those shown in FIG. 1 are designated at the same reference numerals and will not be described in detail.

This embodiment differs from the first embodiment in that an extension region is provided in the channel region and between the source and drain regions 21. To be more specific, a second insulating sidewall 31 is formed on the first insulating sidewall 18, and a p+ type extension region 32 is formed beneath the insulating sidewalls 18 and 31. The source and drain regions 21 have been formed by, for example, ion implantation using the second insulating sidewall 31 as a mask.

In the first embodiment described above, the source and drain regions 21 are formed by using the insulating sidewall 18 provided on the sides of the gate electrode 17. The strained Si layer 14 and SiGe layer 13 that constitute the channel region are surrounded by the source and drain regions 21 and buried insulating film 12. The layers 14 and 13 are therefore floating from the Si substrate 11. This is a phenomenon inherent to SOI elements. In the second embodiment, the channel region is connected to the Si substrate 11 by the depletion-inhibiting layer 22, not by the source and drain regions 21. Hence, the strained Si layer 14 and the SiGe layer 13 are prevented from floating from the Si substrate 11.

To manufacture the SOI-MOSFET according to the second embodiment, a so-called extension region 32 being very thin is formed after the structure of FIG. 3D has been obtained in the first embodiment. Next, a second insulating sidewall 31 is formed, and source and drain regions 21 are formed by using the sidewall 31 as mask. Subsequently, a depletion-inhibiting layer 22 is formed, which contacts the source and drain regions 21 and inhibits a depletion layer from expanding in the semiconductor layer that contacts the source and drain regions 21. As a result, the depletion layer would not isolate the channel region from the Si substrate 11.

The SOI-MOSFET thus fabricated has not only the advantages of the SOI-MOSFET according to the first embodiment, but also some other advantages. That is, the potential can be fixed since the channel region is electrically connected to the Si substrate 11, and the strained Si layer 14 and SiGe layer 13 are prevented from floating from the Si substrate 11. In addition, the thin-film SOI structure controls the short-channel effect.

Modified Embodiment

The present invention is not limited to the embodiments that have been described above.

The embodiments are p-channel MOFETs. Nevertheless, this invention can be applied to n-channel MOSFETs, too. Further, it can be applied to complementary MOSFETs, each comprising p- and n-channel MOSFETs formed on the same substrate.

The insulating sidewall may peel from the sides of the gate electrode. In view of this, the SOI-MOSFET according to this invention need not have insulating sidewalls. The SOI-MOSFET according to this invention is characterized in that the SOI structure is electrically connected to the support substrate by no depletion layers.

The second semiconductor layer, or an Si layer, may be epitaxially grown on the support substrate to a level higher than the interface between the strained Si layer and the gate insulating film. In this case, an elevated source/drain structure will be obtained. Further, the buried insulating film is not limited to Si oxide film. Instead, any other type of insulating film can be provided.

The substrate may be an SGOI substrate comprising an SiGe layer. In this case, too, an SiGe-MOSFET can be provided, which has strain acting along one axis only. Alternatively, the substrate may be a SOI substrate that includes no SiGe layers and comprises only a buried insulating film and an unstrained Si layer laid directly on the buried insulating film. In this case, too, the same advantages are achieved. FIG. 5 is a sectional view schematically illustrating the structure of a modified SOI-MOSFET according to this invention. As FIG. 5 shows, the modified SOI-MOSFET has an Si layer 51 (first semiconductor layer) formed on the buried insulating film 12 and strained along one axis only. The present invention is characterized by the use of a semiconductor layer in which lattice strain acting along one axis (gate-width direction) is preserved and lattice strain acting in the gate-length direction is relaxed. The material and composition of the first semiconductor layer can be changed as needed.

In the embodiments, an oxide film is used as gate insulating film. Nonetheless, the gate insulating film may be an insulating film other than an oxide film. That is, this invention can be applied to not only MOSFETs but also MISFETs. Moreover, the process of shaping the buried insulating film and the first semiconductor layer into islands is not limited to etching of the Si layer, SiGe layer and Si oxide film by using the gate and the insulating sidewall on the gate as mask. Instead, the Si layer, SiGe layer and Si oxide film may be etched by using a mask formed on the gate. This etching results in a SOI-MOSFET that has the same structure as the embodiments described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a gate for a Metal-Insulator Semiconductor (MIS) transistor on a support substrate;
   a buried insulating film formed in one part of the substrate, the buried insulating film being longer in a gate-width direction than in a gate-length direction of the gate for the MIS transistor;
   a first semiconductor layer of strained SiGe formed on the buried insulating film and having lattice strain in the gate-width direction and lattice strain relaxed in the gate-length direction;
   a second semiconductor layer covering both sides of the buried insulating film and both sides of the first semiconductor layer, said sides being opposite in the gate-length direction;
   a gate electrode for the MIS transistor formed on the first semiconductor layer with a gate insulating film being formed between the gate electrode and the first semiconductor layer; and
   a source region and a drain region for the MIS transistor which are formed in the second semiconductor layer,
   wherein the second semiconductor layer is an Si layer.

2. The semiconductor device according to claim 1, wherein a depletion-inhibiting layer of a conductivity type opposite to a conductivity type of the source and drain regions is formed in a bottom region of the source and drain regions.

3. The semiconductor device according to claim 1, wherein an extension region having a smaller junction depth than the first semiconductor layer is formed on sides of the source and drain regions which contact the first semiconductor layer.

4. The semiconductor device according to claim 3, wherein an insulating sidewall is formed on sides of the gate electrode which oppose each other in the gate-length direction, and the extension region is formed beneath the insulating sidewall.

5. The semiconductor device according to claim 1, wherein the second semiconductor layer is a layer epitaxially grown from the support substrate, and the second semiconductor layer is doped with impurities for forming the source and drain regions.

6. The semiconductor device according to claim 1, wherein $W \leqq 2L$, where W is a distance the first semiconductor layer and buried insulating film extend in the gate-width direction and L is a distance the first semiconductor layer and buried insulating film extend in the gate-length direction.

\* \* \* \* \*